United States Patent
Niijima

(10) Patent No.: US 7,197,682 B2
(45) Date of Patent: Mar. 27, 2007

(54) SEMICONDUCTOR TEST DEVICE AND TIMING MEASUREMENT METHOD

(75) Inventor: Hirokatsu Niijima, Tokyo (JP)

(73) Assignee: Advantest Corporation, R Tokyo (JP)

(\*) Notice: Subject to any disclaimer, the term of this patent is extended or adjusted under 35 U.S.C. 154(b) by 223 days.

(21) Appl. No.: 10/936,392

(22) Filed: Sep. 8, 2004

(65) Prior Publication Data
US 2005/0034044 A1 Feb. 10, 2005

Related U.S. Application Data

(63) Continuation of application No. PCT/JP03/02724, filed on Mar. 7, 2003.

(30) Foreign Application Priority Data
Mar. 8, 2002 (JP) ............................. 2002-063342

(51) Int. Cl.
   G01R 31/28 (2006.01)
   G06F 11/00 (2006.01)
(52) U.S. Cl. .................. 714/731; 714/700; 714/798
(58) Field of Classification Search ................ 714/700, 714/731, 798
   See application file for complete search history.

(56) References Cited

U.S. PATENT DOCUMENTS 6,282,680 B1 \* 8/2001 Takagi et al. ............... 714/724
7,010,729 B2 \* 3/2006 Doi et al. .................... 714/700

FOREIGN PATENT DOCUMENTS

JP 4-259869 9/1992

OTHER PUBLICATIONS

Patent Abstracts of Japan, publication No. 04-259869, publication date Sep. 16, 1992 (1 page).
Advantest Corp., "Handotai Shiken Sochi ni Okeru Cycle-Kan no Sokutei", Japan Institute of Invention and Innovation (JIII), Journal of Tecnical Disclosure, (Jul. 16, 2001), 2001-4056, full text.
International Search Report dated Jun. 17, 2003 (2 pages).

\* cited by examiner

Primary Examiner—Cynthia Britt
(74) Attorney, Agent, or Firm—Osha·Liang LLP

(57) ABSTRACT

A semiconductor test equipment and a timing measuring method for use in the semiconductor test equipment are provided, that can perform simultaneous measurement of timings of defined times between edges in cycles even in a case where a capacity is large as in a test pattern for the semiconductor test equipment or a case where the cycles are away from each other. In order to achieve this, the semiconductor test equipment includes: a data shifting flip-flip for shifting input data with a reference clock of the semiconductor test equipment by a period of one clock, provided in a secondary logical comparison circuit 71; the first logical comparison and selection circuit 71a for determining whether timings of the first defined time Ta that is a period between two pre-selected edges are good or not, and outputting a determination result; and the second logical comparison and selection circuit 71b for determining whether timings of the second defined time Tb that is a period between two pre-selected edges are good or not, and outputting a determination result.

11 Claims, 12 Drawing Sheets

| SELECTION INPUT END | | SELECTION OUTPUT |
|---|---|---|
| FSEL11a FSEL11b (S1) | FSEL01a FSEL01b (S0) | |
| 0 | 0 | OUT1 (RESUT AT POINT C) |
| 0 | 1 | OUT2 (RESUT AT POINT D) |
| 1 | 0 | OUT11 (RESUT AT POINT A) |
| 1 | 1 | OUT12 (RESUT AT POINT B) |

*FIG. 2A*

| SELECTION INPUT END | | SELECTION OUTPUT |
|---|---|---|
| FSEL11a FSEL11b (S1) | FSEL01a FSEL01b (S0) | |
| 0 | 0 | CPE1 |
| 0 | 1 | CPE2 |
| 1 | 0 | CPE11 |
| 1 | 1 | CPE12 |

*FIG. 2B*

| SELECTION INPUT END | | LOOKUP TABLE 0:PASS 1:FAIL | MPX3a MPX3b INPUT |
|---|---|---|---|
| S1 | S0 | | |
| 0 | 0 | 0 | A |
| 0 | 1 | 1 | B |
| 1 | 0 | 0 | C |
| 1 | 1 | 0 | D |

*FIG. 2C*

SEMICONDUCTOR TEST DEVICE AND TIMING MEASUREMENT METHOD

The present application is a continuation application of PCT/JP03/02724 filed on Mar. 7, 2003 which claims priority from Japanese patent application No. 2002-63342 filed on Mar. 8, 2002, the contents of which are incorporated herein by reference.

FIELD OF THE INVENTION

The present invention relates to a semiconductor test equipment and a timing measurement method thereof, that can measure a time between cycles (a pulse width on a high side or low side, a period of a clock, or the like) even in a case where an output of a device under test contains jitter, so as to determine whether or not the measured timing is a predetermined time.

RELATED ART

Referring to FIGS. 6–10, an exemplary conventional technique is described.

First, for a semiconductor test equipment, a structure and operations of respective blocks in the structure are generally described. The semiconductor test equipment is known, especially techniques associated therewith are well known. Therefore, except for a main part related to the present application, detailed description of signals and components is omitted.

As shown in FIG. 6, the main part of the semiconductor test equipment includes a timing generator (TG) 10, a waveform formatting unit (FC) 20, a pattern generator (PG) 30 and a plurality of channels of level comparison circuits 41, . . . , 4n, timing comparison circuits 51, . . . , 5n, primary logical comparison circuits 61, . . . , 6n and secondary logical comparison circuits 71, . . . , 7n, where the number of the channels of the level comparison circuits is n.

The semiconductor test equipment tests a device under test (DUT) 90.

In the description set forth below, an operation is described for one of the n channels. Moreover, after conversion by the level comparison circuit 41 using a VOL level and a VOH level so as to obtain a logical signal, two lines of the same circuit design are provided and, for each of the two lines, timing comparison and logical comparison are performed. However, since circuits of the two lines have the same circuit design, the description is made mainly for one line shown in FIG. 6.

The pattern generator 30 supplies a plurality of logical patterns to the waveform formatting unit FC 20 in synchronization with a basis clock output from the timing generator 10 and also supplies expected values (EXP1–EXP4) and comparison enable signals (CPE1–CPE4) to two lines of the logical comparison circuits 61. Two comparison enable signals CPE1 and CPE2 are applied to a typical system and commonly used therein, as shown in a main part circuitry in FIG. 11. However, in this description, a case is described where four comparison enable signals are used.

The waveform formatting unit 20 obtains a test waveform from the logical pattern from the pattern generator 30 and a clock signal (CLK) from the timing generator 10.

The thus obtained test waveform is converted into a predetermined test voltage level by a driver (not shown) and is then output to input pins of the DUT 90.

An output signal P1 output from output pins of the DUT 90 is received by two level comparison circuits 41 that compare it with a low-level comparison voltage VOL and a high-level comparison voltage VOH so as to output logical signals SL and SH, respectively.

The low-level comparison voltage VOL used in one of the level comparison circuits 41 is a voltage source of a desired variable voltage that is to be determined as a low level. The high-level comparison voltage VOH used in the other level comparison circuit 41 (it does not appear in FIG. 6 because it is overlapped by the low-level comparison circuit 41) is a voltage source of a desired variable voltage that is to be determined as a high level. In a case where an intermediate voltage between the high-level comparison voltage VOH and the low-level comparison voltage VOL, that intermediate voltage is determined as a high-impedance output HiZ (VOL<HiZ<VOH).

The timing comparison circuit 51 in this system includes four strobe circuits for performing timing determination. Two low-side comparators (CMP1, CMP2) receive one logical signal SL, and simultaneously perform timing determination for a rising edge and a falling edge of the logical signal SL input thereto, based on two strobe signals STRB1, STRB2 from TG 10. Logical outputs (FL1, FL2) that is results of determination are supplied to the logical comparison circuit 61. Please note that a variable delay circuits VD1, VD2 are minute delay circuits that are provided for correcting differences between an SL-side path and an SH-side path and variations among parts because the strobe signals are commonly used both in the SL-side path and the SH-side path.

The remaining two converters, i.e., high-side converters (that does not appear in FIG. 6 because they are overlapped by the two low-side converters) similarly operate. Thus, they receive the logical signal SH and outputs logical outputs (FL3, FL4) that are results of timing determination based on the two strobe signals STRB1, STRB2.

The SL-side primary logical comparison circuit 61 generates PASS/FAIL signals as a result of comparison with two expected values. The reason why two types of expected values are provided is because, in a case where the DUT is a device in which data transfer is performed in synchronization with both the rising and falling edges of the clock in one test cycle, such as a DDR type memory device, non-defective/defective determination has to be performed for both the edges simultaneously. Thus, the SL-side primary logical comparison circuit 61 receives the aforementioned logical outputs (FL1, FL2) and the expected values (EXP1, EXP2) from the pattern generator 30, and supplies fail information indicating that logics of each logical output and the expected value corresponding thereto are not coincident, to AND gates (AND1, AND2) from a corresponding one of EX-OR gates (EOR1, EOR2).

Each of the AND gate (AND1, AND2) receives from the pattern generator 30 a comparison enable signal (CPE1, CPE2) for controlling enabling/preventing of non-defective/defective determination in a given test cycle based on description of a pattern program, and outputs the fail information indicating that the logics are not coincident, as a comparison output (OUT1 or OUT2) when the corresponding comparison enable signal is enabled. The comparison output, as well as the comparison enable signal (CPE1, CPE2), are supplied to the secondary logical comparison circuit 71.

The SH-side primary logical comparison circuit 61 (it does not appear in FIG. 6 because it is overlapped by the SL-side circuit 61) similarly operates. Thus, the fail information indicating that the logics of each logical output (FL3 or FL4) and the corresponding expected value (EXP3 or EXP4) are not coincident, as a comparison output (OUT3 or OUT4) when the comparison enable signal (CPE3 or CPE4) is enabled.

Please note that the typical system uses the same signal as CPE1 for CPE3 and also uses the same signal as CPE2 for CPE4, as shown in the diagram of the main circuitry in FIG. 11.

Next, for the primary logical comparison circuit 61 and the secondary logical comparison circuit 71, a technique is described for precisely measuring a timing in the cycles of the DUT output without being affected by jitter.

This technique has been partially disclosed in Technical Bulletin No. 2001-4056 published on Jul. 16, 2001. The contents thereof are described below, referring to FIGS. 7, 8 and 9.

An SDRAM (Synchronous DRAM), that is an exemplary DUT, can perform high-speed data translation because an external bus interface writes and reads data in synchronization with a clock signal.

A DDR (Double Data Rate) memory can process data at a speed twice a rate of an input clock.

However, those high-speed DUTs may contain jitter in their output signals. Thus, a conventional semiconductor test equipment cannot measure PASS/FAIL determination with good timing precision.

Moreover, for those high-speed DUTs, it is necessary to measure timings in two cycles of their output data.

Thus, the inventor partially disclosed a technique that can measure a time Ta from a point A to a point B, shown in FIG. 8, with high precision in the aforementioned Technical Bulletin No. 2001-4056. Please note that a CLK input in FIG. 8 represents a clock signal applied to a DUT by a semiconductor test equipment or another measurement device.

An exemplary structure shown in FIG. 7 corresponds to one specific structure of the secondary logical comparison circuit 71 in FIG. 6. The primary logical comparison circuit 61 is the same as that shown in FIG. 6. The secondary logical comparison circuit 71 includes AND gates AND3 and AND4, multiplexers MPX1, MPX2 and MPX3, and a lookup table REG1. This circuit is a functional circuit that determines whether an output signal of the DUT has a pulse width satisfying the defined time Ta even in a case where the output signal contains jitter.

The lookup table REG1 is a register for storing data of a pass/fail condition in the non-defective/defective determination of the defined time Ta and can be set externally. In this example, the lookup table REG1 supplies a 4-bit set value to the multiplexer MPX3.

The multiplexer MPX3 outputs pass/fail information that is a result of selecting one of the 4-bit set value from the lookup table REG1, based on the comparison outputs OUT1 and OUT2 received from the primary logical comparison circuit 61. Thus, it is possible to output the determination result of the defined time Ta, such as a pulse width on a high side or a low side or a period of a clock, based on two kinds of timing determination, i.e., the determination for STRB1 and that for STRB2 that are generated at a desired interval. Consequently, determination that is not affected by fluctuations such as jitter is possible.

The AND gates AND3 and AND4 are gate circuits which enable the output from the multiplexer MPX3 only when both the comparison enable signals CPE1 and CPE2 are enabled.

The multiplexers MPX1 and MPX2 are set to select a terminal B by an operation mode signal SEL supplied externally, so as to output the PASS/FAIL signal, in a case where a typical logical comparison result is output. In a case of using the function of determining the defined time Ta related to the present application, the multiplexers MPX1 and MPX2 are set to select a terminal A by the operation mode signal SEL so as to output an output signal from the AND gate AND3 as a PASS/FAIL signal.

Moreover, in a case of measuring a timing between cycles, measurement is repeated while the interval between STRB1 and STRB2 is gradually increased. Thus, from a timing difference between STRB1 and STRB2 at a time at which PASS/FAIL result of STRB1 and that of STRB2 are coincident, the timing between cycles can be measured.

Therefore, the time of the maximum or minimum time defined between cycles can be measured without being affected by jitter.

In the structure shown in FIG. 6, two lines of secondary logical comparison circuits 71 are provided. However, in a typical system, only one line of the secondary logical comparison circuit 71 is provided whereas two lines of the primary logical comparison circuits 61 are provided, as shown in FIG. 11. The logical comparison circuit 71 in FIG. 11 is the same as that in FIG. 7 except for the following. That is, in the secondary logical comparison circuit 71, OR gates OR1, OR2 are provided therein, logical sum of comparison outputs OUT1 and OUT2 is obtained as a logical output OUT1*d*, and logical sum of comparison outputs OUT3 and OUT4 is obtained as a logical output OUT2*d*.

FIG. 9 explains an operation for performing detection of PASS for the output signal of the DUT that contains jitter, from STRB1, STRB2 and the lookup table. This specific example is described below. In this description, a case is described where, in a case where the DUT output changes to HiZ, VOL, VOH, HiZ comparison and VOL comparison are performed by STRB1 and STRB2, respectively, thereby measuring and determining that the DUT output is equal to or less than the defined time Ta.

First, setting values in the lookup table REG1 are set in such a manner that "1" indicating FAIL is output when OUT2 is "0" indicating PASS and OUT1 is "1" indicating FAIL.

STRB1 and STRB2 strobe at a constant interval equal to the defined time Ta, as shown in FIG. 9. While the first logical comparison selection circuit 71*a* is moved to five strobe points (T11, T12, T13, T14, T15) one by one, the measurement is performed five times at each of the five points.

Waveforms shown with (1)–(5) in FIG. 9 are results of strobing performed five times at the strobe point T13. That is, at this strobe point, "P", "F", "P", "F" and "P" are output in that order as the comparison output OUT1 from the five measurements for STRB1 (see B in FIG. 9), while "P", "F", "P", "F" and "P" are output in that order as the comparison output OUT2 from the five measurements for STRB 2 9 (see C in FIG. 9).

In the case of FIG. 9, both the comparison outputs OUT1 and OUT2 are coincident and therefore correspond to cases D or E in FIG. 9. Thus, "0" (pass) is output from the lookup table REG1, and PASS is obtained as a final measurement result. From the above description, it is found that the non-defective/defective determination of the DUT can precisely be performed without being affected by a jitter factor in the DUT output.

FIG. 10 explains an operation of detecting FAIL for the DUT output signal containing jitter, from STRB1, STRB2 and the lookup table. This specific example is described. It is assumed that a waveform shown with (1) exists at a position shown with B in FIG. 10. That is, it is assumed that a time Ta2 of the output signal is shorter than the defined time Ta. Except for the above, this case is the same as the case shown in FIG. 9. The determination in this case is described.

In this case, as the comparison output OUT1 from five measurements for STRB1, "F", "F", "P", "F" and "P" are output in that order (see C in FIG. 10), while "P", "F", "P", "F" and "P" are output in that order as the comparison output OUT2 from five measurements for STRB2 (see D in FIG. 10).

For the waveform (1), the comparison output OUT1 is "F" and the comparison output OUT2 is "P". Thus, this corresponds to a combination shown with E in FIG. 10. Therefore, "1" (fail) is output from the lookup table REG1 and FAIL is detected as a final measurement result. Accordingly, it is found that the non-defective/defective determination of the DUT can be precisely performed without being affected by a jitter factor contained in the DUT output.

As described above, even if the DUT output contains jitter, the defined time Ta can be measured with high precision by using two strobe signals.

However, even the logical comparison circuit 71 mentioned above is not sufficient to accommodate various tests for a DUT. For example, there is a device for which determination of both successive defined times Ta and Tb has to be performed simultaneously in real time for a DUT output signal containing jitter shown in FIG. 4. The conventional technique has a problem that those defined times Ta and Tb cannot be measured simultaneously.

Moreover, there is a device for which non-defective/defective determination has to be performed in real time based on information on results of strobing performed successively twice. The conventional technique has a problem that such determination cannot be performed in real time based on the information on the results of strobing performed successively twice.

SUMMARY OF THE INVENTION

Therefore, it is one of objects of the present invention to provide a semiconductor test equipment and a timing measurement method therefor, that can receive a DUT output signal containing jitter and determine a plurality of successive defined times simultaneously in real time.

It is another object of the present invention to provide a semiconductor test equipment and a timing measurement method therefor, that can receive a DUT output signal containing jitter and perform non-defective/defective determination in real time based on information on results of strobing successively performed a plurality of times.

The first means to solve the problems is described. FIGS. 1 and 6 show this means according to the present invention.

In order to solve the above problems, according to one embodiment of the invention, a semiconductor test equipment for testing a device under test (DUT), comprises: a timing generator (TG); a waveform formatting unit (FC); a pattern generator (PG); n level comparison circuits, n being more than one and corresponding to a number of comparator channels; n timing comparison circuits; n primary logical comparison circuits; and n secondary logical comparison circuits 71, wherein two defined times Ta, Tb are measured and determined for a DUT output signal containing jitter output from said device under test (DUT), simultaneously without being affected by a jitter component.

In this semiconductor device, a data shifting flip-flop FF11, FF12, FF13, FF14 for shifting input data with a reference clock of said semiconductor test equipment is provided in said secondary logical comparison circuit 71, and first and second logical comparison and selection circuits 71a and 71b are additionally provided.

The data shifting flip-flop FF11, FF12, FF13, FF14 outputs the first shift unmatch signal OUT11 obtained by shifting the first unmatch signal OUT1 output from said primary logical comparison circuit with said reference clock by a period of one clock, outputs the second shift unmatch signal OUT12 obtained by shifting the second unmatch signal OUT2 output form said primary logical comparison circuit with said reference clock by a period of one clock, outputs the first shift comparison enable signal CPE11 obtained by shifting the first comparison enable signal CPE1 output from PG with said reference clock by a period of one clock, and outputs the second shift comparison enable signal CPE12 obtained by shifting the second comparison enable signal CPE2 output from PG with said reference clock by a period of one clock.

The first logical comparison and selection circuit 71a is a circuit for determining whether timings of the first defined time Ta that is a period between two pre-selected edges are good or not, and outputting a determination result, and selects two relevant edges for forming the first defined time Ta, from said first and second unmatch signals OUT1 and OUT2 output from said primary logical comparison circuit and said first and second shift unmatch signals OUT11 and OUT12 output from said data shifting flip-flop FF11, FF13, that were detected at four different timings, and outputs a first final determination fail signal 71af1 that is a fail signal as a final result of determination based on said selected two unmatch signals.

The second logical comparison and selection circuit 71b is a circuit for determining whether timings of the second defined time Tb that is a period between two pre-selected edges are good or not, and outputting a determination result, and selects two relevant edges for forming said second defined time Tb from said first and second unmatch signals OUT1 and OUT2 output from said primary logical comparison circuit and said first and second shift unmatch signals OUT 11 and OUT12 output from said data shifting flip-flop FF11, FF13, that were detected at four different timings, and outputs a second final determination fail signal 71bf1 that is a fail signal as a final result of determination based on said selected two unmatch signals.

The first and second defined times Ta and Tb are determined to be good or not, without being affected by said jitter component contained in said DUT output signal.

Next, the second means to solve the problems is described. FIGS. 1 and 6 show the second means according to the present invention.

In order to solve the aforementioned problems, a semiconductor test equipment for testing a device under test (DUT), comprising: a timing generator (TG); a waveform formatting unit (FC) a pattern generator (PG); n level comparison circuits, n being more than one and corresponding to a number of comparator channels included in said semiconductor test equipment; n timing comparison circuits; n primary logical comparison circuits; and n secondary logical comparison circuits 71, wherein for a DUT output signal containing jitter output from said device under test (DUT), two defined times Ta and Tb are measured and determined simultaneously to be good or not without being affected by said jitter component.

In this semiconductor test equipment, a data shifting flip-flop FF11, FF12, FF13, FF14 for shifting input data with a reference clock of said semiconductor test equipment by a period of one clock is provided in said secondary logical comparison circuit 71.

The first logical comparison and selection circuit 71a for determining whether timings of the first defined time Ta that is a period between two pre-selected edges are good or not, and outputting a determination result is provided in said semiconductor test equipment.

The second logical comparison and selection circuit 71b for determining whether timings of the second defined time Tb that is a period between two pre-selected edges are good or not, and outputting a determination result is provided in said semiconductor test equipment.

By including the above components, the first and second defined times Ta and Tb are determined to be good or not, without being affected by said jitter component contained in said DUT output signal.

Next, the third means to solve the problems is described. FIG. 1 shows the third means according to the present invention.

In an embodiment of the data shifting flip-flop FF11, FF12, FF13, FF14, it outputs the first shift unmatch signal OUT11 obtained by shifting the first unmatch signal OUT1 output from said primary logical comparison circuit with said reference clock by a period of one clock, outputs the second shift unmatch signal OUT12 obtained by shifting the second unmatch signal OUT2 output from said primary logical comparison circuit with said reference clock by a period of one clock, outputs the first shift comparison enable signal CPE11 obtained by shifting the first comparison enable signal CPE1 output from PG with said reference clock by a period of one clock, and outputs the second shift comparison enable signal CPE12 obtained by shifting the second comparison enable signal CPE2 output from PG with said reference clock by a period of one clock.

Next, the fourth means to solve the problems is described. FIG. 1 shows the fourth means according to the present invention.

In an embodiment, the first logical comparison and selection circuit 71a is a circuit for determining whether timings of said first defined time Ta that is a period between two pre-selected edges are good or not, and outputting a determination result, and selects two relevant edges forming said first defined time Ta from said first and second unmatch signals OUT1 and OUT2 output from said primary logical comparison circuit and said first and second shift unmatch signals OUT11 and OUT12 output from said data shifting flip-flop FF11, FF13, that were detected at four different timings, and outputs the first final determination fail signal 71a/1 that is a fail signal of a final result of determination based on said two unmatch signals thus selected.

Next, the fifth means to solve the problems is described. FIG. 1 shows the fifth means according to the present invention.

In an embodiment, the second logical comparison and selection circuit 71b is a circuit for determining whether timings of said second defined time Tb that is a period between two pre-selected edges are good or not, and outputting a determination result, and selects two relevant edges forming said second defined time Tb from said first and second unmatch signals OUT1 and OUT2 output from said primary logical comparison circuit and said first and second shift unmatch signals OUT11 and OUT12 output from said data shifting flip-flop FF11, FF13, that were detected at four different timings, and outputs the second final determination fail signal 71b/1 that is a fail signal of a final result of determination based on said two unmatch signals thus selected.

Next, the sixth means to solve the problems is described. FIGS. 1 and 6 show the sixth means according to the present invention.

TG supplies first and second strobe signals STRB1 and STRB2 that are able to be generated at predetermined timings to each of said timing comparison circuits.

The waveform formatting unit (FC) receives a plurality of logical patterns from PG and supplies a test waveform formatted based on a clock for determining whether timings from said timing generator to the DUT are good or not.

PG supplies said plurality of logical patterns to said waveform formatting unit, supplies first, second, third and fourth expected value patterns EXP1, EXP2, EXP3, EXP4 that are compared with said DUT output signal in logical comparison to said n primary logical comparison circuits, and supplies first, second, third and fourth comparison enable signals CPE1, CPE2, CPE3, CPE4 for indicating that determination is enabled/disabled to said n primary logical comparison circuits and said n secondary logical comparison circuits.

The level comparison circuit receives said DUT output signal, converts said DUT output signal with a voltage level of a low-level comparison voltage VOL that is a predetermined threshold level into a low-side logical signal SL, also converts said DUT output signal with a voltage level of a high-level comparison voltage VOH that is a predetermined threshold level into a high-side logical signal SH and supplies said low-side logical signal SL and said high-side logical signal SH.

The first and third comparison enable signals CPE1 and CPE3 are the same or irrelevant to each other, while said second and fourth comparison enable signals CPE2 and CPE4 are the same or irrelevant to each other.

Next, the seventh means to solve the problems is described. FIG. 6 shows the seventh means according to the present invention.

The timing comparison circuit receives said low-side logical signal SL and supplies the first timing determination signal FL1 that is a result of timing determination based on the first strobe signal STRB1 received from TG and the second timing determination signal FL2 that is a result of timing determination based on the second strobe signal STRB2 received from TG to said primary logical comparison circuit, and also receives said high-side logical signal SH and supplies the third timing determination signal FL3 that is a result of timing determination based on the first strobe signal STRB1 received from TG and the fourth timing determination signal FL4 that is a result of timing determination based on the second strobe signal STRB2 received from TG to said primary logical comparison circuit.

Next, the eighth means to solve the problems is described. FIG. 6 shows the eighth means according to the present invention.

The primary logical comparison circuits include a low-level side primary logical comparison circuit 61 for handling a low-level side of said DUT output signal and a high-level side primary logical comparison circuit 61 for handling a high-level side of said DUT output signal.

The low-level side primary logical comparison circuit 61 supplies the first unmatch signal OUT1 to said secondary logical comparison circuit when the first comparison enable signal CPE1 received from PG is asserted to the secondary logical comparison circuit when the first expected value pattern EXP1 received from PG is unmatched with the first timing determination signal FL1 in logical comparison, and also supplies the second unmatch signal OUT2 to said secondary logical comparison circuit when the second comparison enable signal CPE2 received from PG is asserted to the secondary logical comparison circuit when the second expected value pattern EXP2 received from PG is unmatched with the second timing determination signal FL2 in logical comparison.

The high-level side primary logical comparison circuit 61 supplies the third unmatch signal OUT3 to said secondary logical comparison circuit when the third comparison enable signal CPE3 received from PG is asserted to the secondary logical comparison circuit when the third expected value pattern EXP3 received from PG is unmatched with the third timing determination signal FL3 in logical comparison, and also supplies the fourth unmatch signal OUT4 to said secondary logical comparison circuit when the fourth comparison enable signal CPE4 received from PG is asserted to the secondary logical comparison circuit when the fourth expected value pattern EXP4 received from PG is unmatched with the fourth timing determination signal FL4 in logical comparison.

The first and third comparison enable signals CPE1 and CPE3 are the same or irrelevant to each other, while the second and fourth comparison enable signals CPE2 and CPE4 are the same or irrelevant to each other.

Next, the ninth means to solve the problems is described. FIG. 12 shows the ninth means according to the present invention.

The secondary logical comparison circuit 71 includes an input signal addition unit (OR gates OR1, OR2, for example) for receiving two signals, obtaining a logical sum of said two signals and supplying said logical sum to a circuit provided after said input signal addition unit. The input signal addition unit receives the first and second unmatch signals OUT1 and OUT2 output from said low-level side primary logical comparison circuit 61 described above and said third and fourth unmatch signals OUT3 and OUT4 output from said high-level side primary logical comparison circuit 61 described above, supplies a combined signal that is a logical sum of the first and third unmatch signals OUT1 and OUT3 to said circuit after said input signal addition unit as a first unmatch signal OUT1 and supplies another combined signal that is a logical sum of the second and fourth unmatch signals OUT2 and OUT4 to said circuit after said input signal addition unit as a second unmatch signal OUT2.

Next, the tenth means to solve the problems is described. FIG. 1 shows the tenth means according to the present invention.

The semiconductor test equipment is provided with a start signal START for resetting an output state of said data shifting flip-flop FF11, FF12, FF13, FF14, which is generated by PG.

Next, the eleventh means to solve the problems is described. FIG. 3 shows the eleventh means according to the present invention.

In order to solve the aforementioned problems, a timing measuring method for use in a semiconductor test equipment for measuring timings of a DUT output signal is provided, in which the semiconductor test equipment is a semiconductor test equipment mentioned above.

In a case where the first edge A, the second edge B, the third edge C and the fourth edge D of a waveform output from said DUT output signal are generated in that order, the method includes:

generating a result of timing determination of said first edge A based on the first strobe signal STRB1 received from TG as the first timing determination signal FL1;

generating a result of timing determination of said second edge B based on the second strobe signal STRB2 received from TG as the second timing determination signal FL2;

generating a result of timing determination of said third edge C based on said first strobe signal STRB1 received from TG as the third timing determination signal FL3;

generating a result of timing determination of said fourth edge D based on said second strobe signal STRB2 received from TG as the fourth timing determination signal FL4;

determining whether timings of the first defined time Ta are good or not based on said first and second timing determination signals FL1 and FL2 thus generated; and determining whether timings of the second defined time Tb are good or not based on said third and fourth timing determination signals FL3 and FL4 thus generated.

Next, the twelfth means to solve the problems is described. FIG. 5 shows the twelfth means according to the present invention.

Before strobing of the first, second, third and fourth edges A, B, C and D of said waveform output from said DUT output signal, a data shifting flip-flop FF11, FF12, FF13, FF14 is reset to be initialized.

The means of the present invention may be appropriately combined to provide another practical means, if desired. Moreover, the reference numerals given to the above components correspond to those described in preferred embodiments of the invention. However, the above components are not limited thereto, but may be formed by means to which other practical equivalents are applied.

BRIEF DESCRIPTION OF THE DRAWINGS

FIG. 2 shows exemplary selection signals of the main circuitry of the semiconductor test equipment according to the present invention.

DETAILED DESCRIPTION OF THE INVENTION

Figure 1:
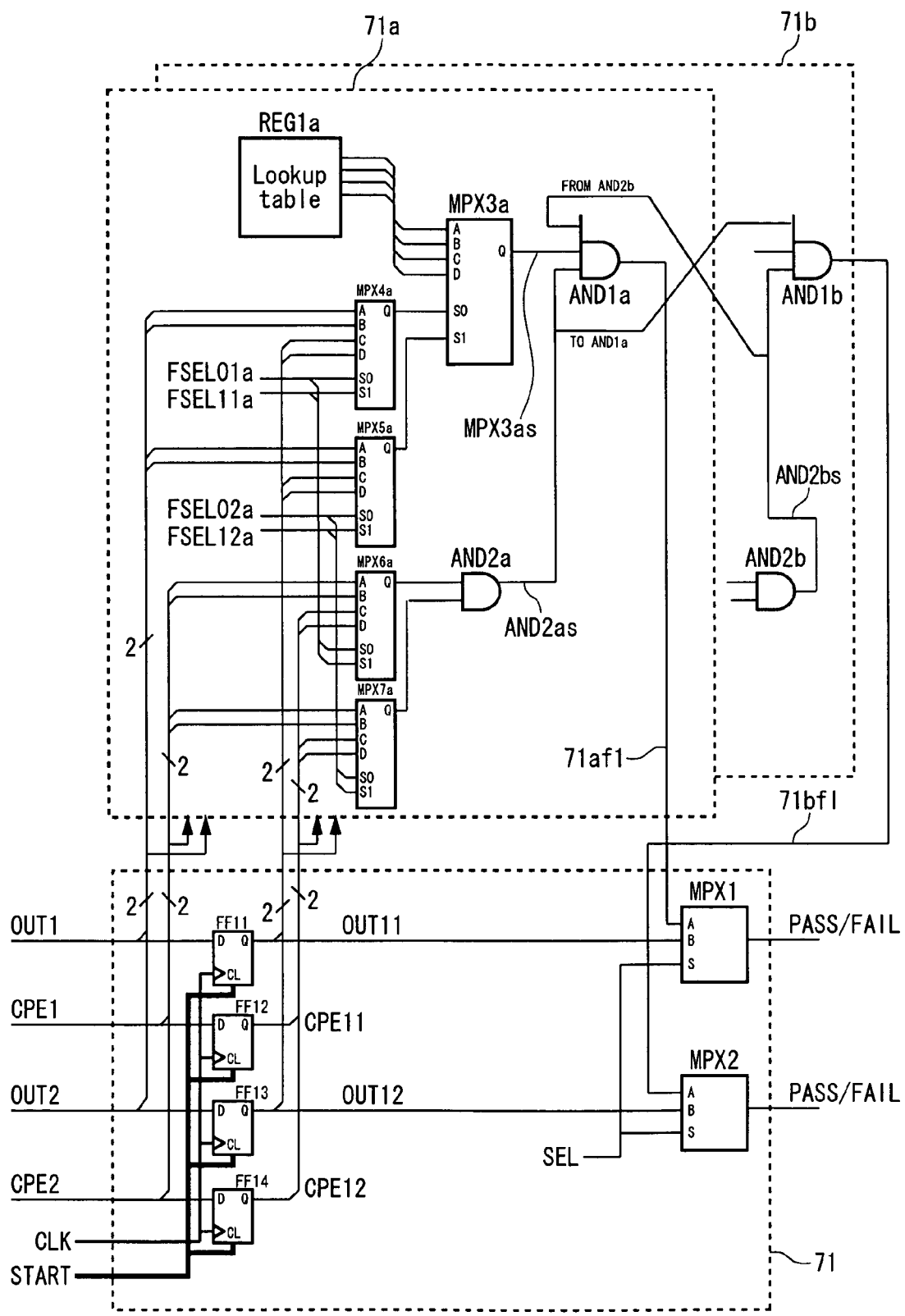
FIG. 1 shows a main circuitry of a secondary logical comparison circuit on a semiconductor test apparatus according to the present invention.

The invention will now be described based on embodiments, referring to the drawings. The following description of the embodiments does not intend to limit the scope of the present invention, but exemplify the invention. All of the components and connections thereof described in the embodiments are not necessarily essential to the invention. Moreover, exemplary forms of the components and connections are described in the embodiments. However, the present invention is not limited those components and connections.

An embodiment of the present invention is described referring to FIGS. 1–6. The components corresponding to the conventionally known components are labeled with the same reference numerals, and description of thereof is omitted unless it is necessary.

FIG. 1 shows a main circuitry of a secondary logical comparison circuit of a semiconductor test equipment according to the present invention.

Figure 6:
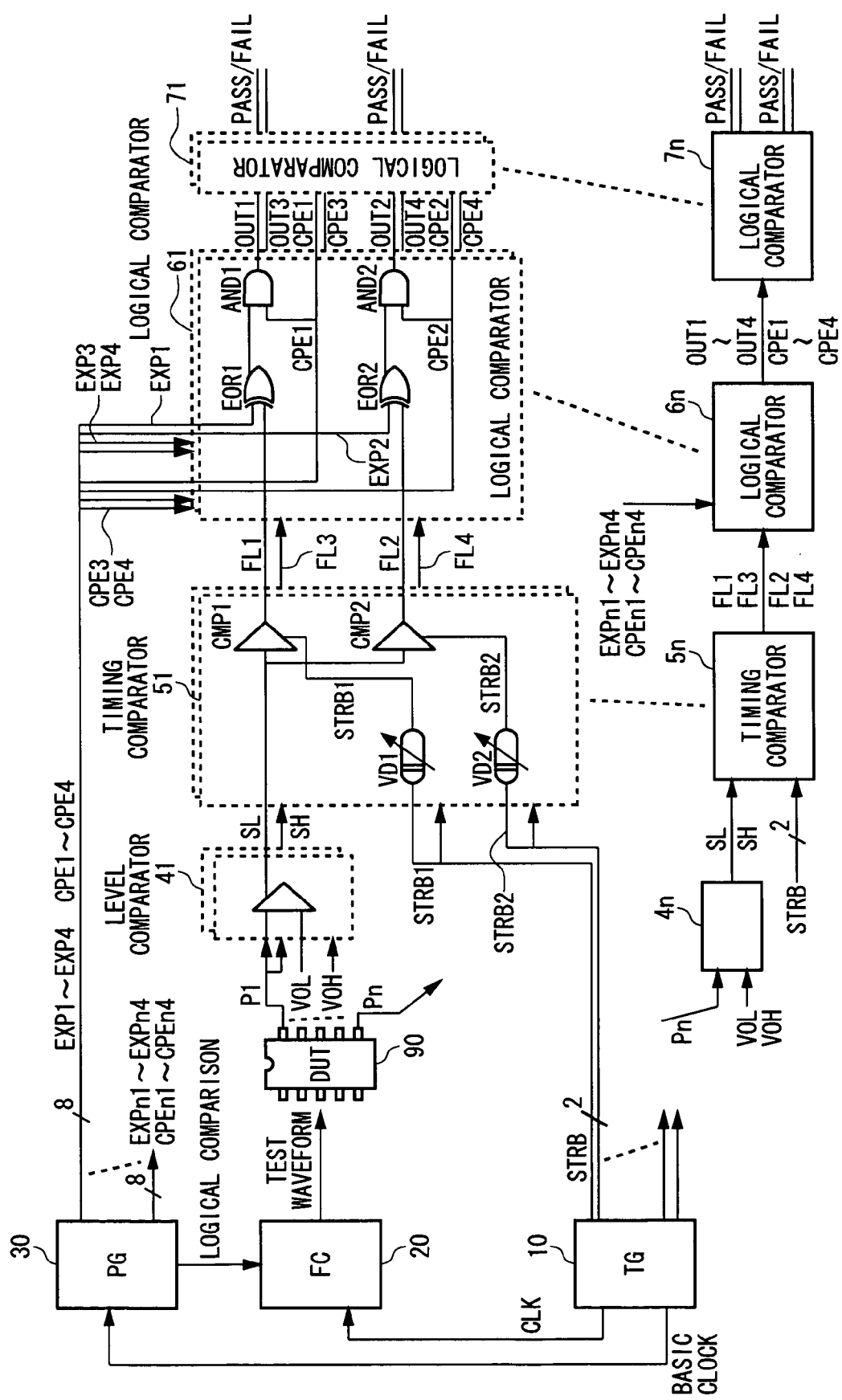
FIG. 6 is a block diagram of a semiconductor test equipment.
Figure 7:
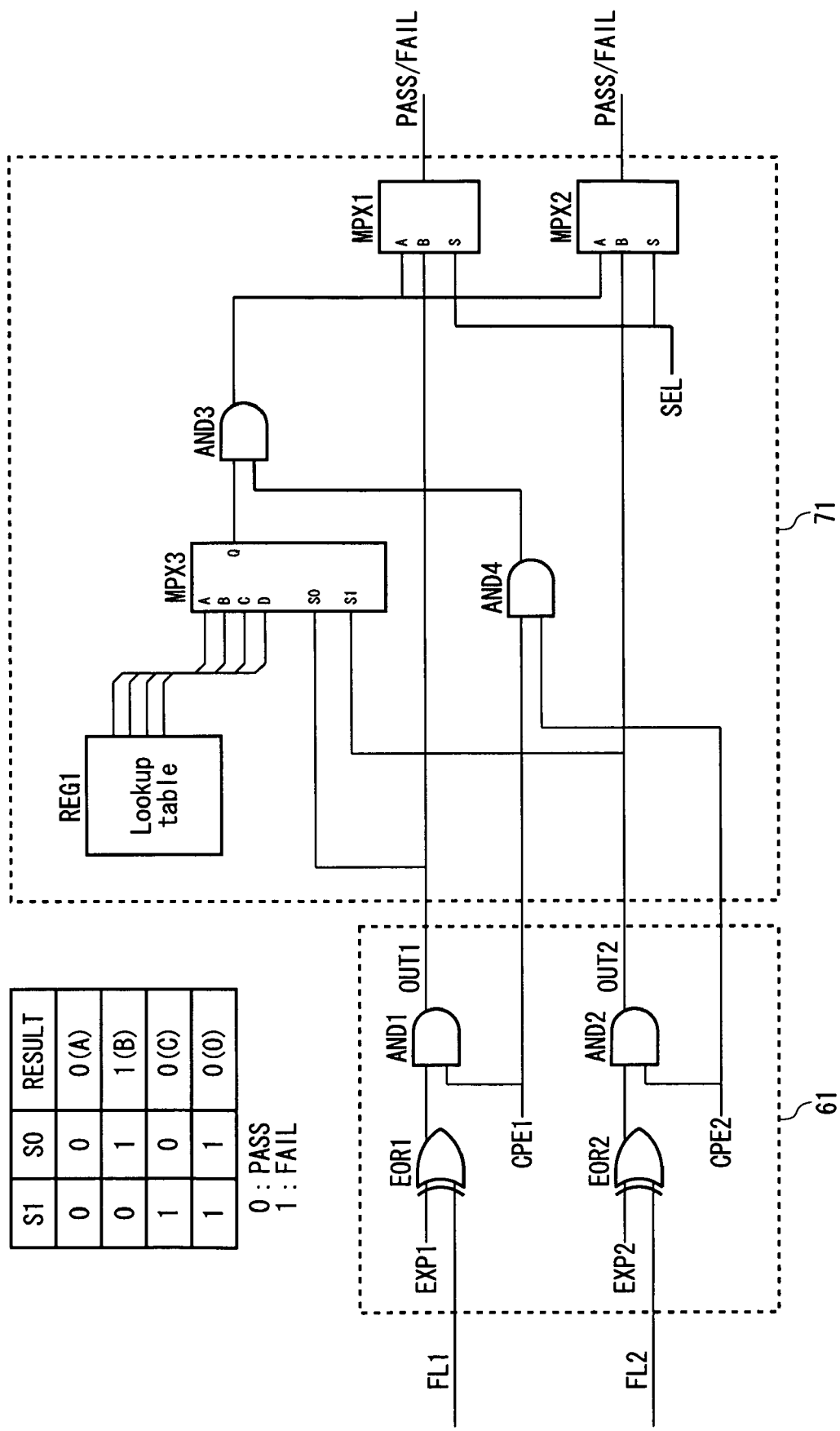
FIG. 7 is an exemplary structure of the secondary logical comparison circuit 71 in the structure of FIG. 6.
Figure 8:
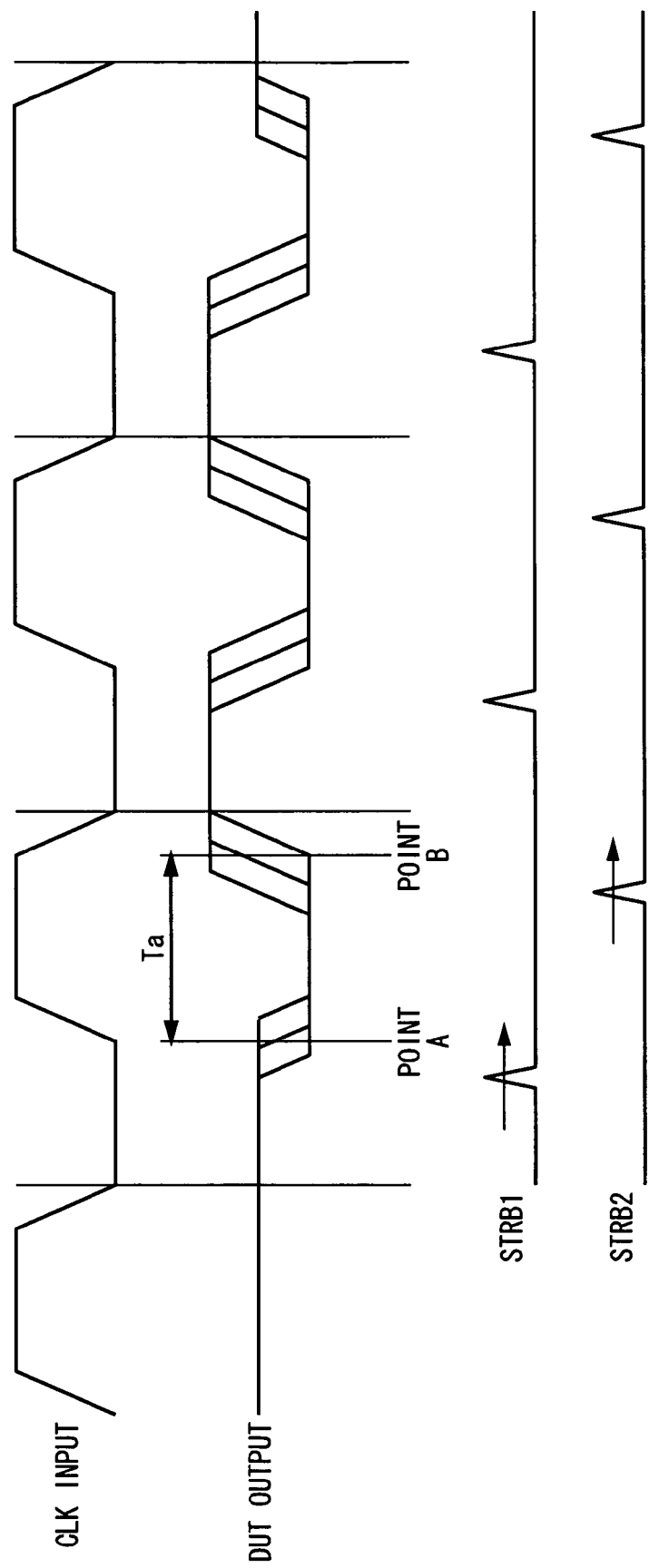
FIG. 8 is an exemplary timing chart of the main circuitry of the conventional semiconductor test equipment.
Figure 9:
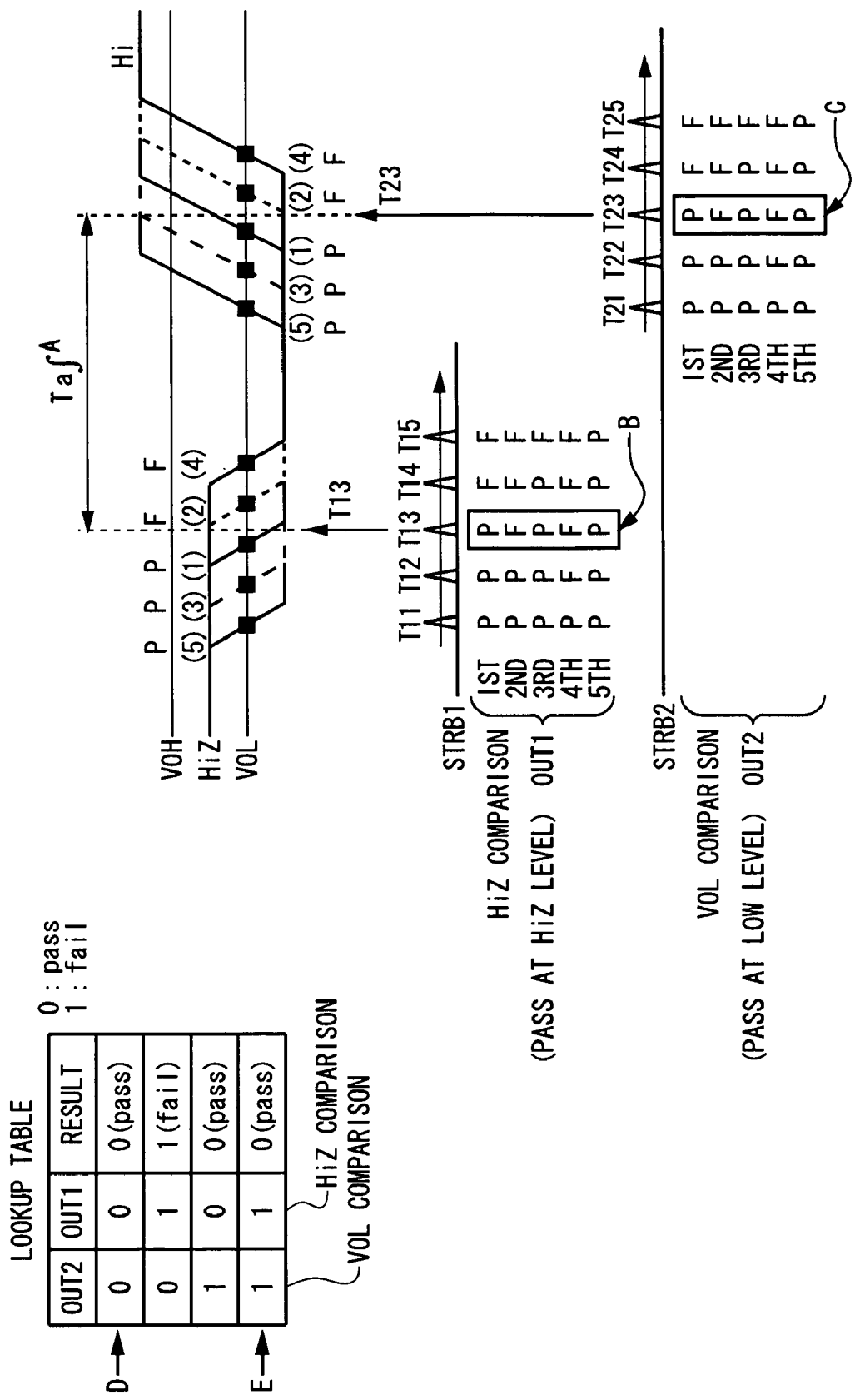
FIG. 9 is a diagram explaining an operation of detecting PASS for a DUT output signal containing jitter, from STRB1, STRB2 and a lookup table.
Figure 10:
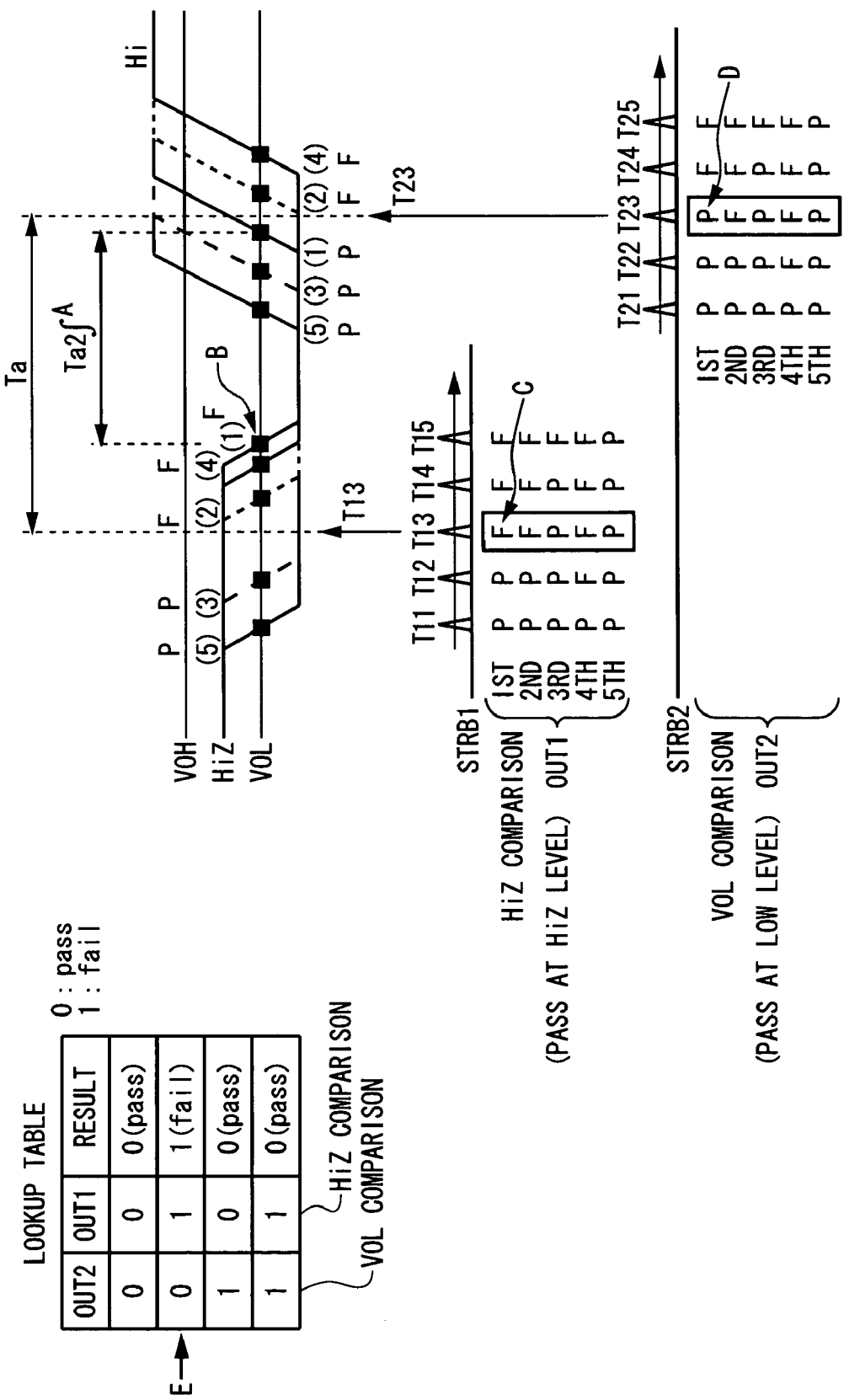
FIG. 10 is a diagram explaining an operation of detecting FAIL for the DUT output signal containing jitter, from STRB1, STRB2 and the lookup table.
Figure 11:
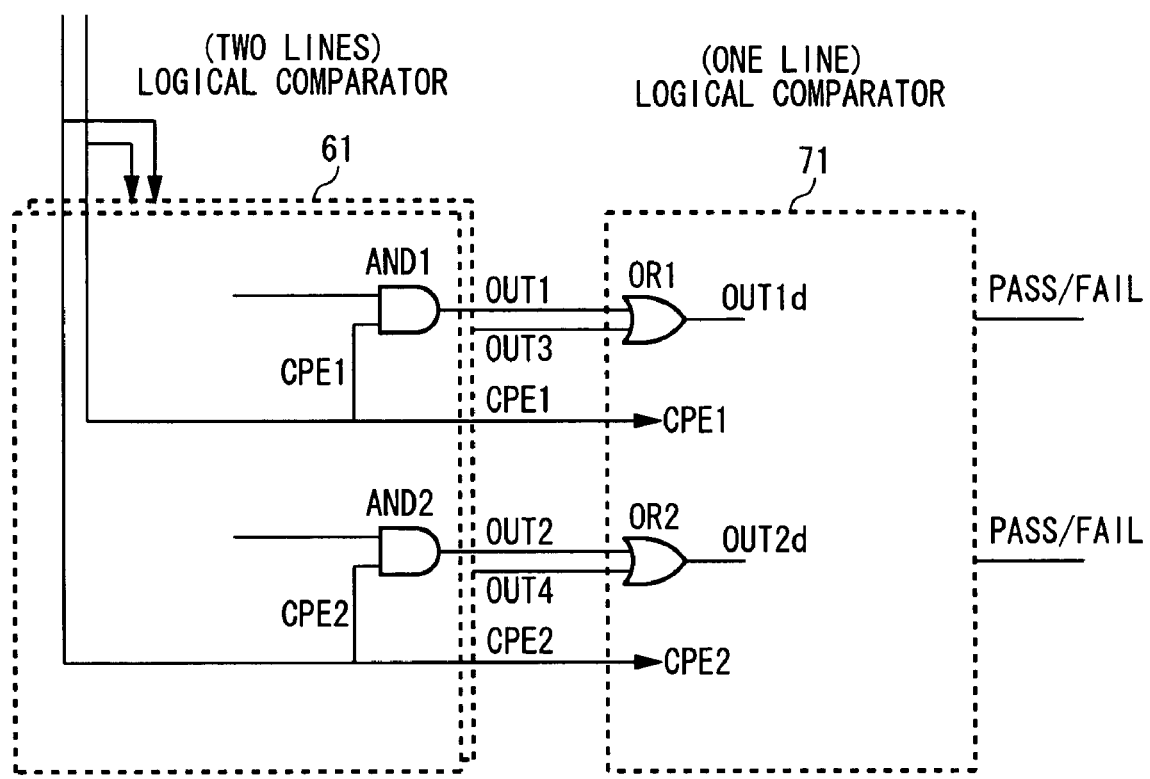
FIG. 11 shows another exemplary structure of the secondary logical comparison circuit 71 and connection between the secondary logical comparison circuit 71 and the primary logical comparison circuit 61.

This secondary logical comparison circuit of the present invention includes two lines of logical comparison and selection circuits, i.e., the first logical comparison and selection circuit 71a and the second logical comparison and selection circuit 71b, in addition to the secondary logical comparison circuit 71 shown in FIG. 6. Each of the logical comparison and selection circuits 71a and 71b receives comparison outputs OUT1, OUT2 and comparison enable signals CPE1, CPE2 as input signals, as in the conventional technique, and a start signal START and a basic clock CLK are applied each logical comparison and selection circuit.

The basic clock CLK is an internal clock provided in the semiconductor test equipment and a clock source that is approximately synchronized with a test rate of a test performed for a DUT. The basic clock CLK has a fixed clock frequency of, for example, 125 MHz.

The main part of the semiconductor test equipment includes the logical comparison circuit 71, the first logical comparison and selection circuit 71a and the second logical comparison and selection circuit 71b, as shown in FIG. 1. Please note that the second logical comparison and selection circuit 71b has the same structure as the first logical comparison and selection circuit 71a.

Figure 3:
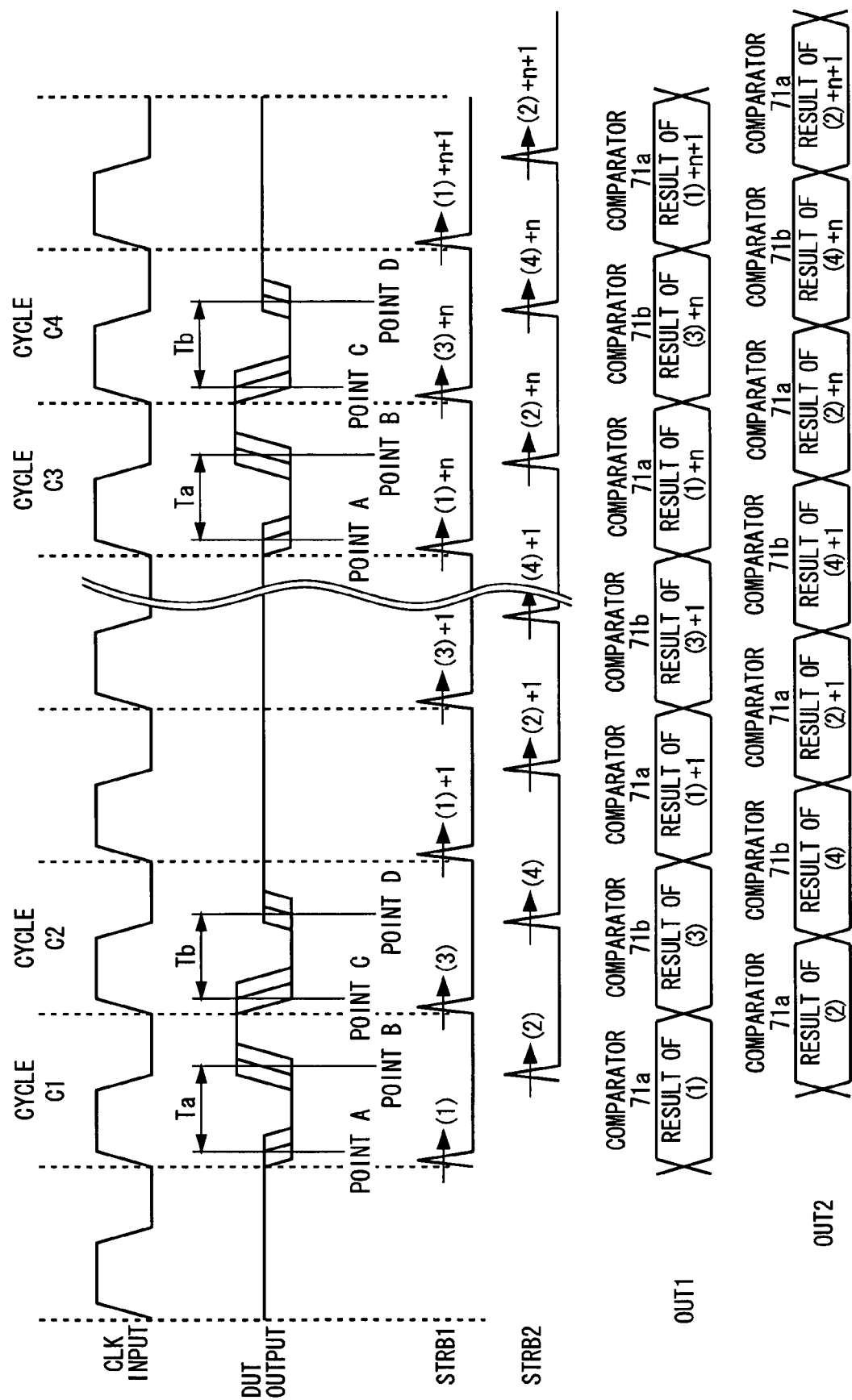
FIG. 3 is an exemplary timing chart in a case where defined times Ta and Tb are subjected to non-defective/defective determination alternately by the circuit structure shown in FIG. 1, with a positional relationship using two cycles forms one unit.

By this structure, timings between cycles in a DUT output containing jitter are simultaneously measured at points A, B, C and D, as shown in an exemplary timing chart in FIG. 3, and it is determined whether or not the measured times are a desired defined time Ta or Tb, without being affected by jitter.

The logical comparison circuit 71 of the present invention includes flip-flops FF11, FF12, FF13, FF14 and multiplexers MPX1, MPX2.

The first logical comparison and selection circuit 71a that is added in the present invention includes multiplexers MAX3a, MPX4a, MPX5a, MPX6a, AND gates AND1a, AND2a and the first lookup table REG1a. The second logical comparison and selection circuit 71b has a similar structure to the first logical comparison and selection circuit 71a, and includes multiplexers MPX3b, MPX4b, MPX5b, MPX6b, AND gates AND1b, AND2b and the second lookup table REG1b.

The flip-flops FF11, FF12, FF13, FF14 receive the comparison output OUT1, the comparison enable signal CPE1, the comparison output OUT2 and the comparison enable signal CPE2 from the primary stage, respectively, and supply shift outputs OUT11, OUT12, that are results of shift outputs using the reference clock CLK, to the first and second logical comparison and selection circuits 71a and 71b and the multiplexers MPX1, MPX2 while supplying shift comparison enable signals CPE11, CPE12 to the first and second logical comparison and selection circuits 71a and 71b. Moreover, the flip-flops are initialized to "0" by an externally applied start signal START. The start signal START is a control signal that can be generated at a desired timing from a pattern generator PG based on a pattern program. This signal is added in the present invention.

The first logical comparison and selection circuit 71a is described. The multiplexers MPX4a, MPX5a, MPX3a and the first lookup table REG1a in the logical comparison and selection circuit 71a, that are provided for OUT1 and OUT2, output pass/fail information that is selected as shown in C of FIG. 2.

More specifically, each of the multiplexers MPX4a, MPX5a is a multiplexer having four inputs and one output, and receives the comparison outputs OUT1, OUT2 from the primary stage at input terminals A, B and the shift outputs OUT11, OUT12 at input terminals C, D, respectively.

One multiplexer MPX4a supplies the first selection signal that indicates a result of selecting one of the terminals A–D based on two selecting signals, i.e., the first fail selecting signals FSEL01a and FSEL11a, to a selection input end S0 of the multiplexer MPX3a. The other multiplexer MPX5a supplies the second selection signal that indicates a result of selecting one of the terminals A–D based on two selecting signals, i.e., the second fail selecting signals FSEL02a and FSEL12a, to a selection input end S1 of the multiplexer MPX3a.

The first selecting signals FSEL01a, FSEL11a and the second selecting signals FSEL02a, FSEL12a are control signals added in the present invention, and are output from a selection register (not shown). Those selecting signals are control signals to satisfy a desired condition based on a pattern program or the like at a start (or in course) of a test, and correspond to 2-bit selection input ends S0 and S1 in C, A and B of FIG. 2.

The first lookup table REG1a is a 4-bit lookup register that can set externally, for example, and stores setting information, that was set in advance, for determining pass/fail in the DUT test. The first lookup table REG1a supplies this setting information to the terminals A, B, C and D of the multiplexer MPX3a.

The multiplexer MPX3a is a multiplexer having four inputs and one output, and supplies pass/fail determination information MPX3 as, that is a result of selecting one of the four bits of the setting information of the first lookup table REG1a based on the above, to the first AND gate AND1a.

According to the above, the pass/fail determination information MPX3 as selected as shown in the example of C in FIG. 2 can be output.

The multiplexers MPX6a, MPX7a and the AND gate AND2a in the first logical comparison and selection circuit 71a, that are provided for CPE, generate a determination enable signal AND2 as.

More specifically, each of the multiplexers MPX6a, MPX7a is a multiplexer having four inputs and one output, and receives the comparison enable signals CPE1, CPE2 from the primary stage at input terminals A, B and the shift comparison enable signals CPE11, CPE12 at input terminals C, D, respectively. One multiplexer MPX6a supplies the first enable signal that is a result of selecting one of the terminals A–D based on two selecting signals, i.e., the first fail selecting signals FSEL01a and FSEL1a, to the AND gate AND2a. The other multiplexer MPX7a supplies the second enable signal that is a result of selecting one of the terminals A–D based on two selecting signals, i.e., the second fail selecting signals FSEL02a and FSEL12a, to the AND gate AND2a.

The AND gate AND2a supplies a determination enable signal to the AND gate 1a and a corresponding AND gate 1b in the second logical comparison and selection circuit 71b when both the first and second enable signals are asserted ("1").

When the determination enable signal from the AND gate AND2a is asserted ("1") and another determination enable signal from a corresponding circuit in the second logical comparison and selection circuit 71b shown in FIG. 1 is also asserted ("1"), the AND gate AND1a receives the aforementioned pass/fail determination information MPX3 as and supplies it as the first final determination fail signal 71af1 that indicates a final determination result to the logical comparison circuit 71. The first final determination fail signal 71af1 thus supplied is output as the first PASS/FAIL information via the multiplexer MPX1 in the logical comparison circuit 71 when an operation mode signal SEL is selected.

Next, the second logical comparison and selection circuit 71b has a similar structure to that of the first logical comparison and selection circuit 71a mentioned above. However, the second lookup table REG1b is used under a desired setting condition. Thus, the second logical comparison and selection circuit 71b outputs the second final determination fail signal 71bf1 that indicates a final determination result, which is then output as the second PASS/FAIL information via the multiplexer MPX2 in the logical comparison circuit 71.

As described above, according to the first and second logical comparison and selection circuits 71a and 71b shown in FIG. 1, it is possible to output the first PASS/FAIL information and the second PASS/FAIL information that were selected in a predetermined manner based on the first fail selecting signals FSEL01a, FSEL11a and the second fail selecting signals FSEL02a, FSLE12a, that are used as selecting signals in the first logical comparison and selection circuit 71a and in the second logical comparison and selection circuit 71b, and were then subjected to non-defective/defective determination. This provides a great advantage that, in a DUT output signal containing jitter, non-defective/defective determination can be performed for two defined times Ta and Tb simultaneously in real time.

In other words, an advantage can be obtained that non-defective/defective determination can be performed in real time by receiving a DUT output signal containing jitter, based on information on results of strobing successively performed twice.

FIG. 3 is a timing chart for explaining a method for simultaneously measuring two defined times Ta and Tb and performing determination for the defined times thus measured, by the circuit shown in FIG. 1. This timing chart is described together with selection tables shown in A and B of FIG. 2. This can be achieved by applying the first and second logical comparison and selection circuits 71a and 71b.

The determination of one defined time Ta is performed by determining the shift outputs OUT11, OUT12 that are shifted results of strobing at points A and B with strobe signals STRB1, STRB2. The first logical comparison and selection circuit 71a performs this determination. By setting a selection register (not shown) for outputting the aforementioned first and second fail selecting signals FSEL01a, FSEL11a, FSEL02a, FSEL12a so as to allow determination using the shift outputs OUT11, OUT12, a selection condition shown in A in FIG. 2 is obtained. The contents of the first lookup table REG1 is also set in a predetermined manner.

For example, in a case where the multiplexer MPX4a shown in FIG. 1 selects the result at the point A in FIG. 3, the first fail selecting signals FSEL01a, FSEL11a are set to specify "0" and "1", respectively. Thus, the shift output OUT11 can be selected. In a case of selecting the result at the point B in FIG. 3 by the multiplexer MPX5a shown in FIG. 1, the second fail selecting signals FSEL02a, FSEL12a are set to specify "1" and "1". Thus, the shift output OUT12 can be selected.

The multiplexers MPX6a, MPX7a for selecting the shift comparison enable signals CPE11, CPE12 supply the above fail selecting signals FSEL01a, FSEL11a or the other fail selecting signals FSEL02a, FSEL12a, so as to achieve a selection example shown in B in FIG. 2.

The determination of the other defined time Tb is performed for the comparison outputs OUT1, OUT2 that are results of strobing at points C and D in FIG. 3 by using the strobe signals STRB1, STRB2. The first logical comparison and selection circuit 71a performs this determination. By setting the selection register (not shown) for outputting the aforementioned first and second fail selecting signals FSEL01a, FSEL11a, FSEL02a, FSEL12a so as to allow determination using the comparison outputs OUT1, OUT2, a selection condition shown in A in FIG. 2 is obtained. The contents of the second lookup table REG1b is also set in a predetermined manner.

For example, in a case where the multiplexer MPX4b (not shown) of the second logical comparison and selection circuit 71b shown in FIG. 1 selects the result at the point C in FIG. 3, fail selecting signals FSEL01b, FSEL11b (not shown) are set to specify "0" and "0". Thus, the comparison output OUT1 can be selected. In a case of selecting the result at the point D in FIG. 3 by the multiplexer MPX5b (not shown) of the second logical comparison and selection circuit 71b shown in FIG. 1, the fail selecting signals FSEL02b, FSEL12b (not shown) are set to specify "1" and "0", respectively. Thus, the comparison output OUT2 can be selected.

The multiplexers MPX6b, MPX7b (not shown) for selecting the comparison enable signals CPE1, CPE2 perform selection in a predetermined manner by the above fail selecting signals FSEL01b, FSEL11b or the other fail selecting signals FSEL02b, FSEL12b.

FIG. 3 shows an exemplary timing chart in a case where determination of the defined time Ta and that of the other defined time Tb are alternately performed while it is assumed that two cycles form one unit. In this case, determination of one defined time Ta is performed using odd-numbered strobe signals STRB1, STRB2, while determination of the other defined time Tb is performed using even-numbered strobe signals STRB1, STRB2. That is, determination of the defined time Ta and that of the defined time Tb are performed in that order in two cycles. Cycles C3 and C4 shown in FIG. 3 also has this relationship, i.e., they form together a unit. When STRB1 at the point A, STRB2 at the point B, STRB1 at the point C and STRB2 at the point D are (1), (2), (3) and (4), respectively, and n is a given integral, the cycle C3 corresponds to ((1)+n)th and ((2)+n) cycles while the cycle C4 corresponds to ((3)+n)th and ((4)+n)th cycles. As a result, it is possible to arrange the first and second logical comparison and selection circuits 71a and 71b in such a manner that the first logical comparison and selection circuit 71a handles determination using (1) and (2) while the second logical comparison and selection circuit 71b handles determination using (3) and (4).

In other words, as shown in FIG. 3, n×2 cycles after determination of the defined times Ta and Tb performed in the cycles C1 and C2, the defined times Ta and Tb are determined normally in the cycles C3 and C4. In a case where such a cycle condition is set, there is no trouble in the device test.

The strobe signals STRB1, STRB2 may strobe at a time at which the strobe signal is not required in each cycle (or in an undetermined cycle). Thus, a program is typically generated so as to perform determination in specified cycles by controlling the comparison enable signals CPE1, CPE2.

However, generation of the test pattern is not limited to the test condition shown in FIG. 3. That is, a limited test pattern for performing determination of the defined times Ta and Tb in that order in two cycles is not always generated. For example, as shown in another exemplary timing chart in FIG. 4, there exist many cases in which a program for performing determination of the defined times Ta and Tb in that order in cycles C4 and C5 is demanded.

Figure 4:
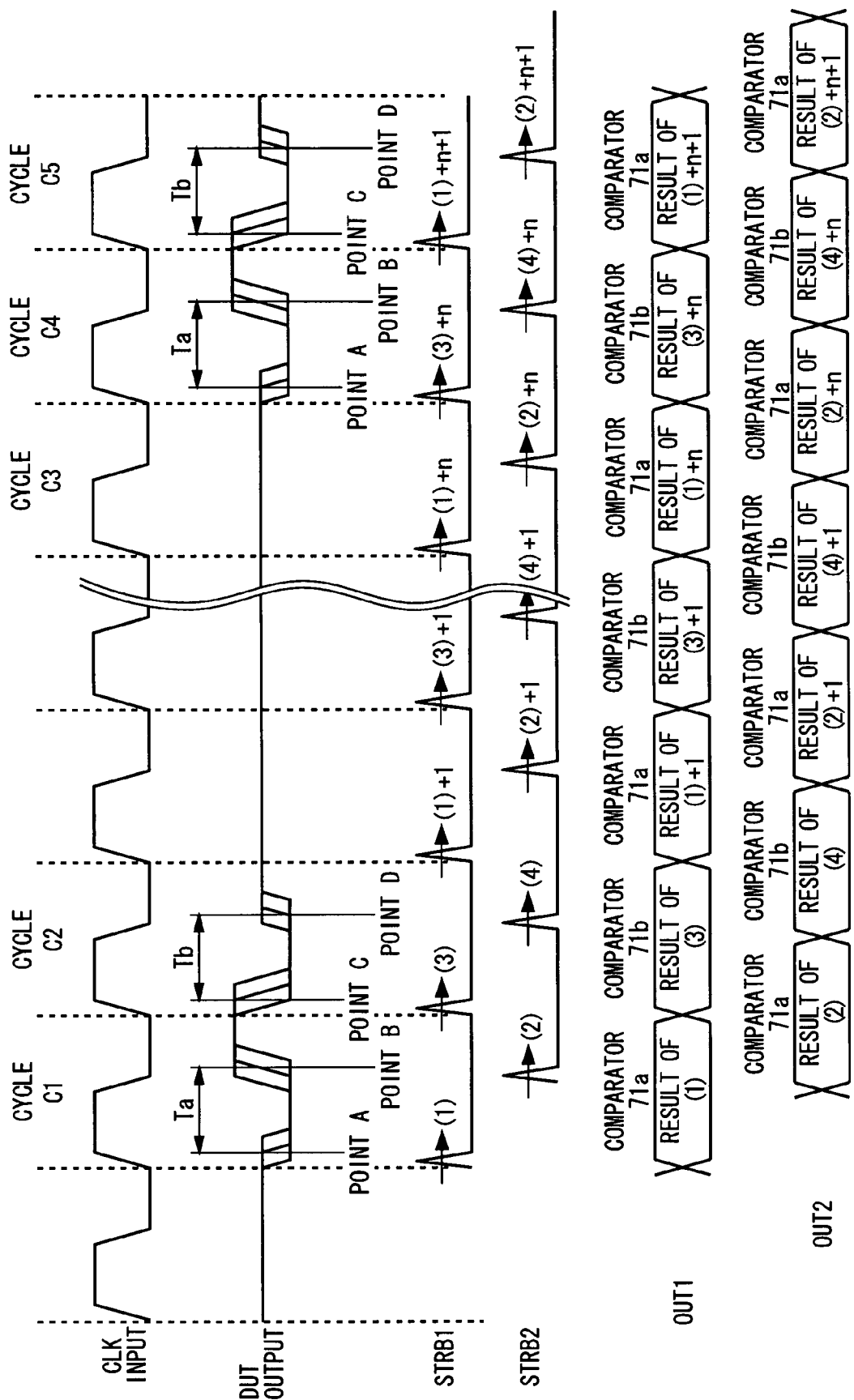
FIG. 4 is an exemplary timing chart in a case where the defined times Ta and Tb are subjected to non-defective/defective determination alternately, with a positional relationship in which one unit is not formed by two cycles.

FIG. 4 shows an exemplary timing chart for alternately performing determination of the defined times Ta and Tb with a positional relationship in which one unit is not formed by two cycles. In this case, there is a trouble in the device test. This trouble is described. In the example of FIG. 4, determination of the defined time Ta is performed in a cycle C4, while determination of the defined time T5 is performed in a cycle C5.

In this case, ((3)+n) is applied to STRB1 in the cycle C4 while ((4)+n) is applied to STRB2 in the cycle C5. Therefore, the STRB condition is reversed.

In other words, in the description of FIG. 3, the respective lookup tables and the first and second fail selecting signals are initialized in such a manner that the first logical comparison and selection circuit 71a handles determination of (1) and (2) and the second logical comparison and selection circuit 71b handles determination of (3) and (4). As a result, although a normal operation is achieved in the cycles C1 and C2, it is not achieved in the cycles C4 and C5. Thus, the semiconductor test equipment does not operate normally. In order to avoid that problem, it is necessary to generate a test pattern carefully in such a manner that both the logical comparison and selection circuits are synchronized in the test pattern to be generated. The aforementioned limitation makes the generation of the test pattern more complicated and difficult and also increases a useless test pattern.

To overcome the above-described drawbacks, a start signal STAER shown in FIG. 1 is additionally provided.

Figure 5:
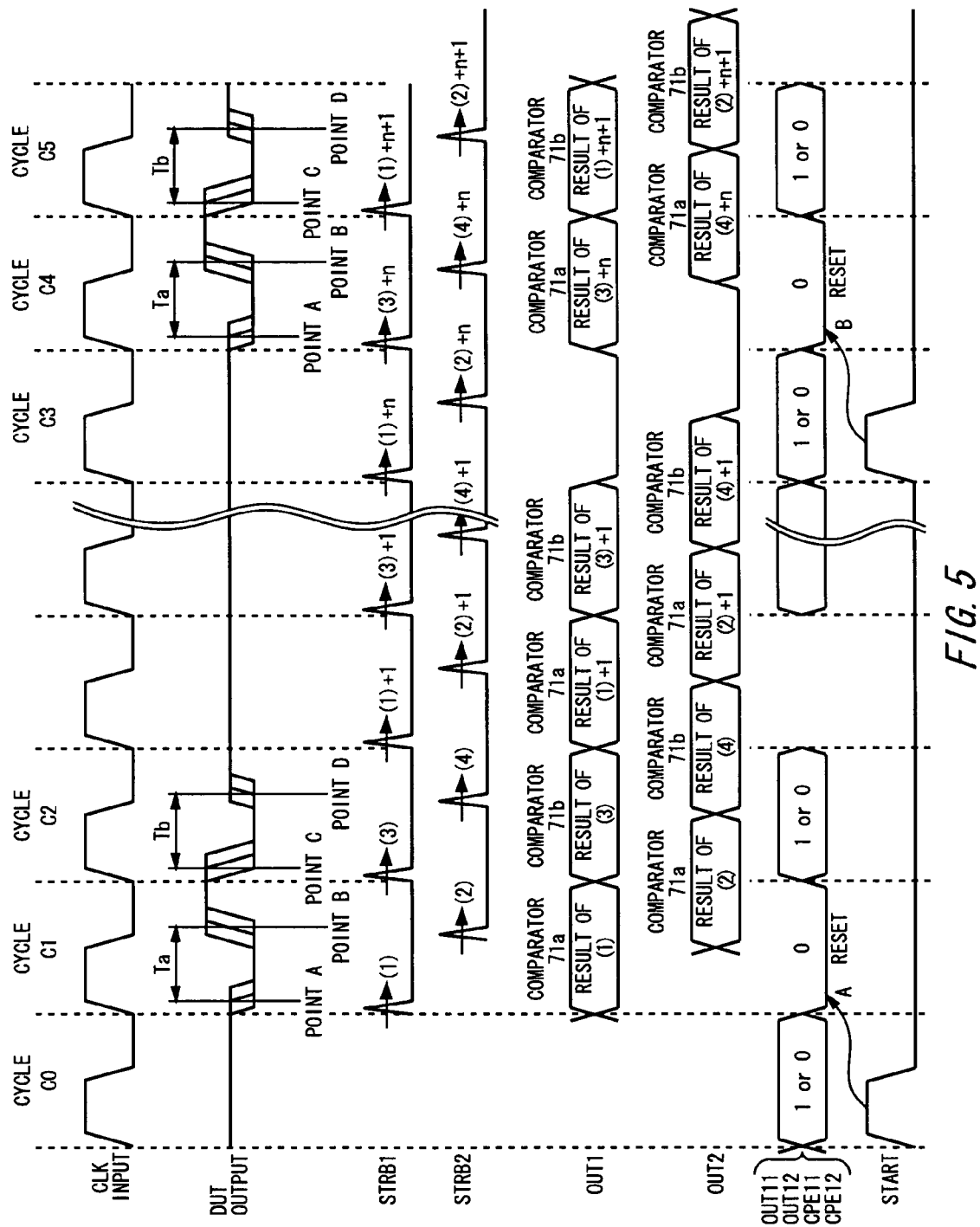
FIG. 5 is an exemplary timing chart in a case where the defined times Ta and Tb are subjected to non-defective/defective determination alternately from a start signal START, with a positional relationship in which one unit is not formed by two cycles.

FIG. 5 shows an exemplary timing chart in a case where the defined times Ta and Tb can be determined with a positional relationship in which one unit is not formed by two cycles, because of the start signal START.

The test pattern is generated in such a manner that the start signal START is generated in cycles C0 and C3 immediately before cycles in which determination of the defined times Ta and Tb are performed. As a result, all the flip-flops FF11 to FF14 provided in the first and second logical comparison and selection circuits 71a and 71b shown in FIG. 1 are reset to "0". That is, in the cycles C1 and C4 shown with A and B in FIG. 5, the shift output OUT11, OUT12 and the shift comparison enable signals CPE11, CPE12 are reset to "0". Thus, an advantage is provided that it is ensured that the non-defective/defective determination of the defined times Ta and Tb, to be performed after the aforementioned reset, can be performed normally. This eliminates the need of consideration whether the determination cycles in the previous test pattern is even-numbered cycles or odd-numbered cycles.

Therefore, as shown in the exemplary timing chart in FIG. 5, the need of generating the test pattern with care in such a manner that the both logical comparison and selection circuits and the test pattern to be generated have a synchronizing relationship therebetween can be eliminated, and the problem of increasing the useless test patterns can be also eliminated. Moreover, a great advantage is obtained that non-defective/defective determination can be performed in given, desired cycles.

It should be noted that the technical spirit of the present invention is not limited to the specific examples or exemplary connection described in the above embodiment. The above embodiment may be modified or changed appropriately based on the technical spirit of the present invention, so as to be applied to broad applications.

Figure 12:
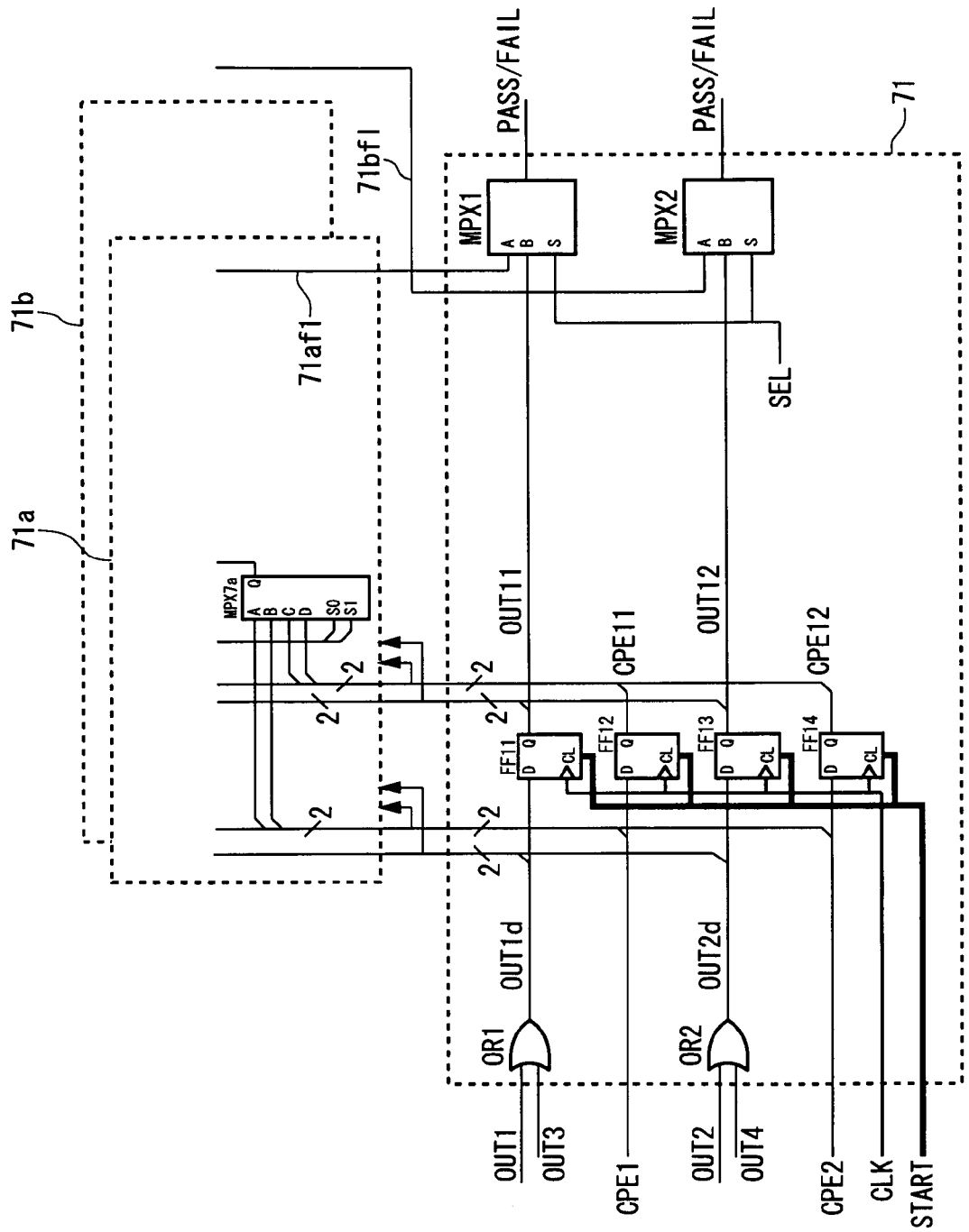
FIG. 12 shows another exemplary structure of the secondary logical comparison circuit 71 shown in FIG. 1 and connection between that secondary logical comparison circuit 71 and the primary logical comparison circuit 61.

In the example of FIG. 1, a case where, for the secondary logical comparison circuits 71, two lines are provided is described. However, in a typical system, only for the secondary logical comparison circuit 71, one line is provided, as shown in FIG. 12. The secondary logical comparison circuit 71 shown in FIG. 12 includes OR gates OR1, OR2 therein, a logical sum of the comparison outputs OUT1, OUT3 is obtained as a comparison output OUT1d, and a logical sum of the comparison outputs OUT2, OUT4 is obtained as a comparison output OUT2d. Except for the above, the secondary logical comparison circuit 71 shown in FIG. 12 has the same structure as that shown in FIG. 1.

For example, in the above embodiment, an example is described in which logical outputs F11, FL2 that were generated and output by the timing comparison circuits 51 in two lines, i.e., the low-side timing comparison circuit 51 and the high-side timing comparison circuit 51 shown in FIG. 6 based on one low-side comparator (CMP1, CMP2) are received, and non-defective/defective determination is performed by the first and second logical comparison and selection circuits 71a and 71b. In an application of the above structure, circuits may be formed in such a manner that four logical outputs FL1, FL2, FL3, FL4 that are output both the low-side comparator and the high-side comparator are received, and non-defective/defective determination is performed in various ways employing a desired combination of the first logical comparison and selection circuits 71a in two lines and the second logical comparison and selection circuits 71b in two lines. In this case, it is possible to perform various types of non-defective/defective determination based on a given combination of the high level, low level and high impedance.

The present invention is implemented in the aforementioned forms and has the following advantages.

According to the first and second logical comparison and selection circuits 71a and 71b shown in FIG. 1, a great advantage can be obtained that, in a DUT output signal containing jitter, non-defective/defective determination of both defined times Ta and Tb can be performed simultaneously in real time.

Moreover, by providing a start signal START shown in FIG. 1, an advantage can be obtained that it is ensured that non-defective/defective determination of the defined times Ta and Tb can be performed normally in given cycles, as shown in the timing chart in FIG. 5. Thus, the need of considering the determination cycles in the previous test pattern can be eliminated. The problem of increasing useless test patterns can be also eliminated.

Therefore, an advantage can be obtained that, for a received DUT output signal containing jitter, it is possible to perform non-defective/defective determination in real time based on information on results of strobing successively performed twice.

What is claimed is:

1. A semiconductor test equipment for testing DUT, comprising: a timing generator (TG); a waveform formatting unit (FC); a pattern generator (PG); n level comparison circuits, n being more than one and corresponding to a number of comparator channels included in said semiconductor test equipment; n timing comparison circuits; n primary logical comparison circuits; and n secondary logical comparison circuits, wherein for a DUT output signal containing jitter output from said device under test, two defined times are measured and determined to be good or not simultaneously without being affected by said jitter component, and wherein said secondary logical comparison circuit comprises a data shifting flip-flop for shifting input data with a reference clock of said semiconductor test equipment by a period of one clock, said semiconductor test equipment comprises a first logical comparison and selection circuit for determining whether timings of a first defined time that is a period between two pre-selected edges are good or not, and outputting a determination result, and a second logical comparison and selection circuit for determining whether timings of a second defined time that is a period between two pre-selected edges are good or not, and outputting a determination result, and said first and second defined times are determined to be good or not, without being affected by said jitter component contained in said DUT output signal.

2. A semiconductor test equipment as claimed in claim 1, wherein said data shifting flip-flop outputs a first shift unmatch signal obtained by shifting a first unmatch signal output from said primary logical comparison circuit with said reference clock by a period of one clock, outputs a second shift unmatch signal obtained by shifting a second unmatch signal output from said primary logical comparison circuit with said reference clock by a period of one clock, outputs a first shift comparison enable signal obtained by shifting a first comparison enable signal output from said pattern generator with said reference clock by a period of one clock, and outputs a second shift comparison enable signal obtained by shifting a second comparison enable signal output from said pattern generator with said reference clock by a period of one clock, and said primary logical comparison circuit supplies a first unmatch signal to said secondary logical comparison circuit when the first comparison enable signal is asserted and a logic comparison of an expected signal pattern from said pattern from said pattern generator with a first timing determination signal from said timing comparison circuit, is determined to be unmatched, and said primary logical comparison circuit supplies a second unmatch signal to said secondary logical comparison circuit when the second comparison enable signal is asserted and a logic comparison of an expected signal pattern from said pattern generator with a second timing determination signal from said timing comparison circuit, is determined to be unmatched.

3. A semiconductor test equipment as claimed in claim 1, wherein said first logical comparison and selection circuit is a circuit for determining whether timings of said first defined time that is a period between two pre-selected edges are good or not, and outputting a determination result, and selects two relevant edges forming said first defined time from said first and second unmatch signals output from said primary logical comparison circuit and said first and second shift unmatch signals output from said data shifting flip-flop, that were detected at four different timings, and outputs a first final determination fail signal that is a fail signal of a final result of determination based on selected said two unmatch signals.

4. A semiconductor test equipment as claimed in claim 1, wherein said second logical comparison and selection circuit is a circuit for determining whether timings of said second defined time that is a period between two pre-selected edges are good or not, and outputting a determination result, and selects two relevant edges forming said second defined time from said first and second unmatch signals output from said primary logical comparison circuit and said first and second shift unmatch signals output from said data shifting flip-flop, that were detected at four different timings, and outputs a second final determination fail signal that is a fail signal of a final result of determination based on selected said two unmatch signals.

5. A semiconductor test equipment as claimed in claim 1, wherein said timing generator supplies first and second strobe signals that are able to be generated at predetermined timings to each of said timing comparison circuits, said waveform formatting unit receives a plurality of logical patterns from said pattern generator and supplies a test waveform formatted based on a clock for determining whether timings from said timing generator are good or not, said pattern generator supplies said plurality of logical patterns to said waveform formatting unit, supplies first, second, third and fourth expected value patterns that are compared with said DUT output signal in logical comparison to said n primary logical comparison circuits, and supplies first, second, third and fourth comparison enable signals for indicating that determination is enabled/disabled to said n primary logical comparison circuits and said n secondary logical comparison circuits, said level comparison circuit receives said DUT output signal, converts said DUT output signal with a voltage level of a low-level comparison voltage VOL that is a predetermined threshold level into a low-side logical signal SL, also converts said DUT output signal with a voltage level of a high-level comparison voltage VOH that is a predetermined threshold level into a high-side logical signal SH and supplies said low-side logical signal SL and said high-side logical signal SH, and said first and third comparison enable signals are the same or irrelevant to each other, while said second and fourth comparison enable signals are the same or irrelevant to each other.

6. A semiconductor test equipment as claimed in claim 5, wherein said timing comparison circuit receives said low-side logical signal SL and supplies a first timing determination signal that is a result of timing determination based on a first strobe signal received from said timing generator and a second timing determination signal that is a result of timing determination based on a second strobe signal received from said timing generator to said primary logical comparison circuit, and also receives said high-side logical signal SH and supplies a third timing determination signal that is a result of timing determination based on said first strobe signal received from said timing generator and a fourth timing determination signal that is a result of timing determination based on said second strobe signal received from said timing generator to said primary logical comparison circuit.

7. A semiconductor test equipment as claimed in claim 6, wherein said n primary logical comparison circuits include a low-level side primary logical comparison circuit for handling a low-level side of said DUT output signal and a high-level side primary logical comparison circuit for handling a high-level side of said DUT output signal, said low-level side primary logical comparison circuit supplies a first unmatch signal to said secondary logical comparison circuit when said first comparison enable signal that is supplied by said pattern generator is asserted and a logic comparison of said first expected signal pattern with said first timing determination signal is determined to be unmatched, and supplies a second unmatch signal to said secondary logical comparison circuit when said second comparison enable signal that is supplied by said pattern generator is asserted and a logic comparison of said second expected signal pattern with said second timing determination signal is determined to be unmatched, said high-level side primary logical comparison circuit supplies a third unmatch signal to said secondary logical comparison circuit when said third comparison enable signal that is supplied by said pattern generator is asserted and a logic comparison of said third expected signal pattern with said third timing determination signal is determined to be unmatched, and supplies a fourth unmatch signal to said secondary logical comparison circuit when said fourth comparison enable signal that is supplied by said pattern generator is asserted and a logic comparison of said fourth expected signal pattern with said fourth timing determination signal is determined to be unmatched, and said first and third comparison enable signals are the same or irrelevant to each other, while said second and fourth comparison enable signals are the same or irrelevant to each other.

8. A semiconductor test equipment as claimed in claim 7, wherein said secondary logical comparison circuit includes an input signal addition unit for receiving two signals, obtaining a logical sum of said two signals and supplying said logical sum to a circuit provided after said input signal addition unit, and said input signal addition unit receives said first and second unmatch signals output from said low-level side primary logical comparison circuit as claimed in claim 7 and said third and fourth unmatch signals output from said high-level side primary logical comparison circuit as claimed in claim 7, supplies a combined signal that is a logical sum of said first and third unmatch signals to said circuit after said input signal addition unit as a first unmatch signal and supplies another combined signal that is a logical sum of said second and fourth unmatch signals to said circuit after said input signal addition unit as a second unmatch signal.

9. A semiconductor test equipment as claimed in claim 1, wherein a start signal START for resetting an output state of said data shifting flip-flop is provided, said start signal being generated by said pattern generator.

10. A timing measuring method for use in a semiconductor test equipment for measuring timings of a DUT output signal, said semiconductor test equipment being a semiconductor test equipment as claimed in claim 2, wherein in a case where first, second, third and fourth edges of a waveform output from said DUT output signal are generated in that order, generating a result of timing determination of said first edge based on a first strobe signal received from a timing generator as a first timing determination signal, generating a result of timing determination of said second edge based on a second strobe signal received from said timing generator as a second timing determination signal, generating a result of timing determination of said third edge based on said first strobe signal received from said timing generator as a third timing determination signal, generating a result of timing determination of said fourth edge based on said second strobe signal received from said timing generator as a fourth timing determination signal, determining whether timings of a first defined time are good or not based on said first and second timing determination signals thus generated, and determining whether timings of a second defined time are good or not based on said third and fourth timing determination signals thus generated.

11. A timing measuring method as claimed in claim 10, wherein before strobing of said first, second, third and fourth edges of said waveform output from said DUT output signal, a data shifting flip-flop is reset to be initialized.

* * * * *